US010591556B2

(12) United States Patent
Cunningham et al.

(10) Patent No.: US 10,591,556 B2
(45) Date of Patent: Mar. 17, 2020

(54) SYSTEM AND METHOD FOR INCREASED SIGNAL-TO-NOISE RATIO IN MULTI SPIN-ECHO PULSE IMAGING

(71) Applicants: Charles H. Cunningham, Toronto (CA); Jeffrey A. Stainsby, Toronto (CA); Andrew T. Curtis, Toronto (CA)

(72) Inventors: Charles H. Cunningham, Toronto (CA); Jeffrey A. Stainsby, Toronto (CA); Andrew T. Curtis, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 306 days.

(21) Appl. No.: 15/797,639

(22) Filed: Oct. 30, 2017

(65) Prior Publication Data

US 2019/0128976 A1 May 2, 2019

(51) Int. Cl.
*G01R 33/24* (2006.01)
*G01R 33/483* (2006.01)
*G01R 33/561* (2006.01)
*G01R 33/44* (2006.01)

(52) U.S. Cl.
CPC ......... *G01R 33/24* (2013.01); *G01R 33/4835* (2013.01); *G01R 33/5617* (2013.01); *G01R 33/445* (2013.01)

(58) Field of Classification Search
CPC ........ G01R 33/00; G01R 33/20; G01R 33/24; G01R 33/44; G01R 33/445; G01R 33/48; G01R 33/4818; G01R 33/483; G01R 33/4833; G01R 33/4835; G01R 33/54; G01R 33/56; G01R 33/561; G01R 33/5611; G01R 33/5615; G01R 33/5617

USPC ....... 324/300, 301, 307, 309, 310, 312, 313, 324/314, 315
See application file for complete search history.

(56) References Cited

U.S. PATENT DOCUMENTS

| 5,557,202 | A  | * | 9/1996 | Miyazaki | G01R 33/5605 |
|||||| 324/307 |
| 10,261,156 | B2 | * | 4/2019 | de Oliveira | G01R 33/4818 |
| 2012/0025824 | A1 | * | 2/2012 | Harder | G01R 33/543 |
|||||| 324/309 |
| 2012/0068704 | A1 | * | 3/2012 | Popescu | G01R 33/4835 |
|||||| 324/309 |
| 2013/0249548 | A1 | * | 9/2013 | Stemmer | G01R 33/4835 |
|||||| 324/309 |

(Continued)

*Primary Examiner* — Hoai-An D. Nguyen
(74) *Attorney, Agent, or Firm* — Ridout & Maybee LLP

(57) ABSTRACT

The present disclosure provides a system for and a method of obtaining a magnetic resonance image by performing magnetic resonance imaging (MRI) at multiple slices simultaneously. The method comprises generating a multiband pulse sequence for spin-echo imaging, the pulse sequence comprising a multiband excitation pulse and at least one multiband refocusing pulse, wherein the multiband excitation pulse simultaneously excites multiple bands, wherein the at least one multiband refocusing pulse simultaneously refocuses the multiple bands, and wherein the phases of the bands excited by the multiband excitation pulse and the phases of the bands refocused by the at least one multiband refocusing pulse are set according to a single row of an orthogonal encoding matrix. The multiband excitation pulse and the at least one multiband refocusing pulse collectively form a multiband pulse pair.

22 Claims, 4 Drawing Sheets

(56) References Cited

U.S. PATENT DOCUMENTS

| | | | |
|---|---|---|---|
| 2014/0253120 A1* | 9/2014 | Ugurbil | A61B 5/055 |
| | | | 324/309 |
| 2016/0231409 A1* | 8/2016 | Taviani | G01R 33/5611 |
| 2018/0100906 A1* | 4/2018 | Choi | G01R 33/54 |

* cited by examiner

SYSTEM AND METHOD FOR INCREASED SIGNAL-TO-NOISE RATIO IN MULTI SPIN-ECHO PULSE IMAGING

FIELD

The present disclosure relates generally to magnetic resonance imaging (MRI) and more specifically, to improving the signal to noise ratio in images acquired using lower magnetic field MRI systems.

BACKGROUND

The signal to noise ratio (SNR) is used in MRI to describe image quality, the relative contributions to a detected signal of the true signal and random signals, or background noise.

A voxel with a larger volume contains more signal, and therefore has a higher SNR. Longer sampling time tends to reduce the noise, and therefore increases the SNR. In addition, the MRI hardware contributes to the SNR through the main magnetic field strength, the receive coil sensitivity and volume, and the receive chain noise performance characteristics. Finally, the tissue itself can contribute to the signal as determined by its relaxation and other characteristics that affect the specific pulse sequence being used.

In order to improve the SNR, typically, either the voxel size has to increase or the sampling time has to increase.

MRI systems which use lower magnetic fields (for example, 0.5 T) tend to result in a lower sample magnetization than in conventional 1.5 T and 3.0 T MRI systems. This also tends to result in a lower SNR in magnetic resonance (MR) images, if all other factors are held equal.

A commonly used pulse sequence in MRI is a spin echo sequence. It has at least two RF pulses, typically a 90° pulse (often called the excitation pulse) and a 180° refocusing pulse that generate the spin echo. Multi-spin echo sequences, or echo-train sequences, are similar. However, they apply multiple 180° refocusing pulses to produce multiple echoes following a single excitation pulse. A refocusing pulse is required for every echo produced.

In general, magnetic resonance images are produced over an imaging volume by selectively exciting and obtaining signals from slices of the imaging volume, using a combination of gradient fields and 'spatially selective' RF pulses. In a spin echo sequence, the repetition time, TR, is the time between successive excitation pulses for a given slice. The echo time, TE, is the time from the excitation pulse to the echo maximum. Each slice is excited and repeatedly refocused by a train of 180-degree refocusing pulses, with data sampling following each of the refocusing pulses. As such, multi spin-echo sequences may be used to efficiently acquire T2-weighted images.

Multiband encoding involves the excitation of multiple slices simultaneously within one TR time period, and the summed signal from this group of slices is typically sampled following each refocusing pulse. A pulse that is configured to perform this multiband encoding may be referred to as a multiband pulse.

Simultaneous multislice imaging using multiband RF pulses have been used in the past to excite multiple frequency bands of magnetization, with the spatial profile of multiple receiver coils used to separate the signal from each respective frequency band from the multi-band signal. However, this method is mainly used to enable more slice coverage in the same imaging time, a form of acceleration and is not used to increase SNR.

SUMMARY

According to an example aspect, the present disclosure provides a magnetic resonance imaging (MRI) system configured to perform a multiband pulse sequence to acquire a magnetic resonance image at multiple slices simultaneously, the MRI system comprising: a processor configured to transmit a multiband pulse pair. The pulse pair comprises a multiband excitation pulse for simultaneously exciting multiple bands, and a multiband refocusing pulse for simultaneously refocusing the multiple bands, wherein the phases of each band in the multiband excitation pulse and the multiband refocusing pulse are set according to a row of an orthogonal encoding matrix. The MRI system further comprising a transmit coil coupled to the processor for generating a multiband pulse sequence comprising the multiband excitation pulse and at least one multiband refocusing pulse during spin-echo or multi-spin-echo imaging.

According to another example aspect, the present disclosure provides a method of obtaining a magnetic resonance image by performing magnetic resonance imaging (MRI) at multiple slices simultaneously. The method comprises generating a multiband pulse sequence for spin-echo imaging, the pulse sequence comprising a multiband excitation pulse and at least one multiband refocusing pulse, wherein the multiband excitation pulse simultaneously excites multiple bands, wherein the at least one multiband refocusing pulse simultaneously refocuses the multiple bands, and wherein the phases of the bands excited by the multiband excitation pulse and the phases of the bands refocused by the at least one multiband refocusing pulse are set according to a single row of an orthogonal encoding matrix, the multiband excitation pulse and the at least one multiband refocusing pulse collectively forming a multiband pulse pair.

BRIEF DESCRIPTION OF THE DRAWINGS

Example embodiments of the present disclosure are provided in the following description. Such description makes reference to the annexed drawings wherein.

DESCRIPTION OF EXAMPLE EMBODIMENTS

Traditional magnetic resonance imaging (MRI) systems represent an imaging modality which is primarily used to construct pictures of magnetic resonance (MR) signals from protons such as hydrogen atoms in an object. In medical MRI, typical signals of interest are MR signals from water and fat, the major hydrogen containing components of tissues.

Figure 1:
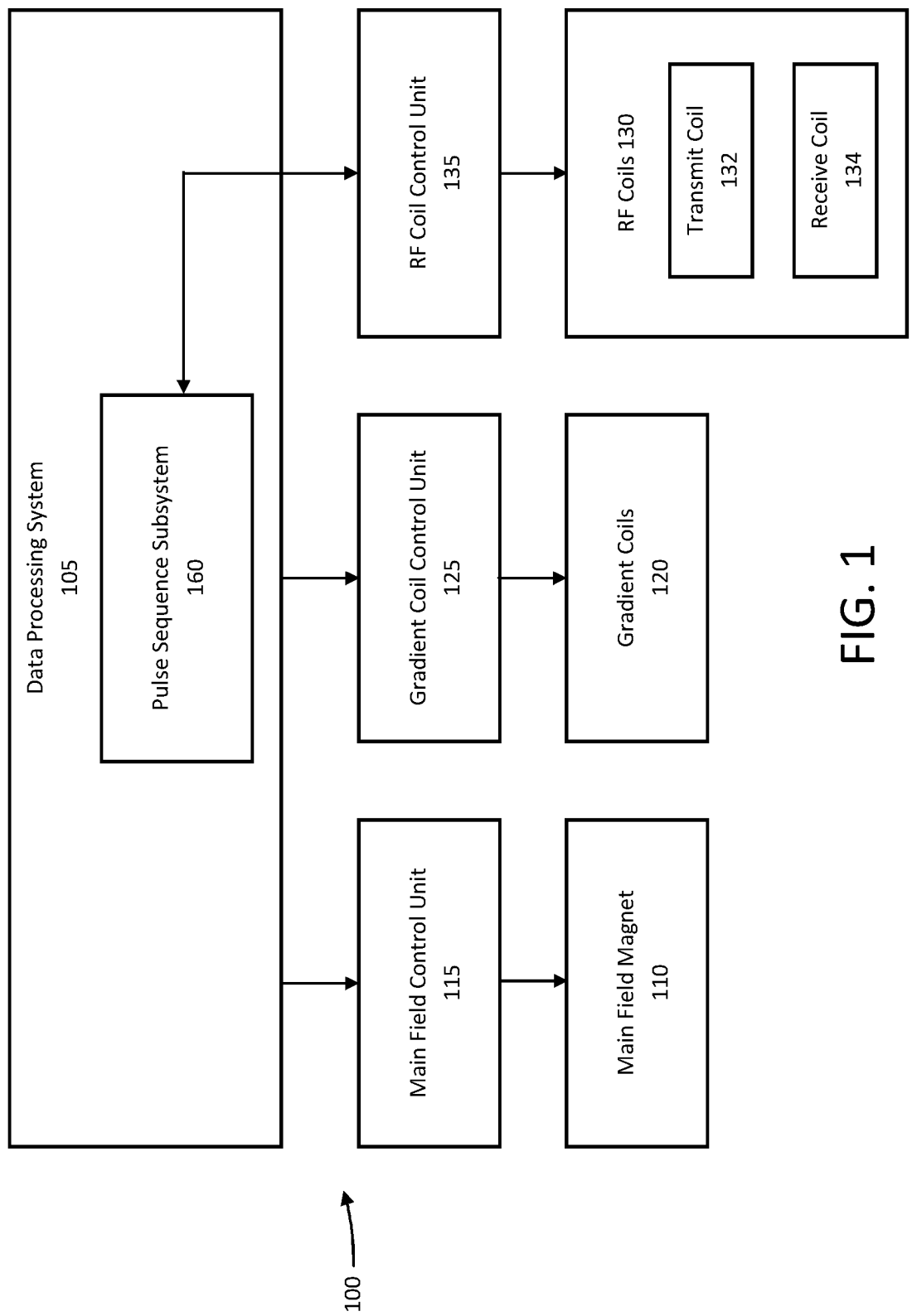
FIG. 1 is a block diagram of a magnetic resonance imaging (MRI) system in accordance with an example embodiment.

Referring to FIG. 1, a block diagram of a MRI system, in accordance with an example implementation, is shown at 100. The example implementation of MRI system indicated at 100 is for illustrative purposes only, and variations including additional, fewer and/or varied components are possible.

As shown in FIG. 1, the illustrative MRI system 100 comprises a data processing system 105. The data processing system 105 can generally include one or more output devices such as a display, one or more input devices such as a keyboard and a mouse as well as one or more processors connected to a memory having volatile and persistent components. The data processing system 105 may further comprise one or more interfaces adapted for communication and data exchange with the hardware components of MRI system 100 used for performing a scan.

Continuing with FIG. 1, example MRI system 100 also includes a main field magnet 110. The main field magnet 110 may be implemented as a permanent, superconducting or a resistive magnet, for example. Other magnet types, including hybrid magnets suitable for use in MRI system 100 are contemplated. Main field magnet 110 is operable to produce a substantially uniform main magnetic field having strength B0 and a direction along an axis. The main magnetic field is used to create an imaging volume within which desired atomic nuclei, such as the protons in hydrogen within water and fat, of an object are magnetically aligned in preparation for a scan. In some implementations, as in this example implementation, a main field control unit 115 in communication with data processing system 105 may be used for controlling the operation of main field magnet 110.

MRI system 100 further includes gradient coils 120 used for encoding spatial information in the main magnetic field along, for example, three perpendicular gradient axes. The size and configuration of the gradient coils 120 may be such that they produce a controlled and uniform linear gradient. For example, three paired orthogonal current-carrying primary coils located within the main field magnet 110 may be designed to produce desired linear-gradient magnetic fields.

In some implementations, gradient coils 120 may be shielded and include an outer layer of shield coils which can produce a counter magnetic field to counter the gradient magnetic field produced by the primary gradient coils forming a primary-shield coils pair. In such a coil pair the "primary" coils can be responsible for creating the gradient field and the "shield" coils can be responsible for reducing the stray field of the primary coil outside a certain volume such as an imaging volume. The primary and shield coils of the gradient coils 120 may be connected in series.

It is also possible to have more than two layers of coils for any given gradient axis that together form a shielded gradient coil. Shielded gradient coils 120 may reduce eddy currents and other interference which can cause artefacts in the scanned images. Since eddy currents mainly flow in conducting components of the MRI system 100 that are caused by magnetic fields outside of the imaging volume (fringe fields), reducing the fringe fields produced by gradient coils 120 may reduce interference. Accordingly, the shapes and sizes, conductor wire patterns and sizes, and current amplitudes and patterns of the primary-shield coils pair can be selected so that the net magnetic field outside the gradient coils 120 is as close to zero as possible. For cylindrical magnets, for example, the two coils may be arranged in the form of concentric cylinders whereas for vertical field magnets, the two coils may be arranged in coaxial disks.

The conductive components of the gradient coils 120, whether shielded or unshielded and including the primary and optional shield coil(s), may include an electrical conductor (for example copper, aluminum, etc.). The internal electrical connections can be such that when a voltage difference is applied to the terminals of the gradient coils 120, electric current can flow in the desired path. The conductive components for the three gradient axes for both the primary gradient coils and the optionally gradient shield coils may be insulated by physical separation and/or a non-conductive barrier.

The magnetic fields produced by the gradient coils 120, in combination and/or sequentially, can be superimposed on the main magnetic field such that selective spatial excitation of objects within the imaging volume occurs. In addition to allowing spatial excitation, the gradient coils 120 may attach spatially specific frequency and phase information to the atomic nuclei placed within the imaging volume, allowing the resultant MR signal to be reconstructed into a useful image. A gradient coil control unit 125 in communication with data processing system 105 may be used to control the operation of gradient coils 120.

In some implementations of MRI system 100, there may be additional electromagnet coils present (not shown), such as shim coils (traditionally, but not limited to, producing magnetic field profiles of 2nd order or higher spherical harmonics) and/or a uniform field offset coil and/or any other corrective electromagnet. To perform active shimming (correcting the field distortions that are introduced when different objects are placed within or around the system), the corrective electromagnets, such as the shim coils, carry a current that is used to provide magnetic fields that act to make the main magnetic field more uniform. For example, the fields produced by these coils may aid in the correction of inhomogeneities in the main magnetic field due to imperfections in the main magnet 110, the presence of external ferromagnetic objects, or susceptibility differences of materials within the imaging region, or due to any other static or time-varying phenomena.

The MRI system 100 further includes radio frequency (RF) coils 130. The RF coils 130 are used to establish an RF magnetic field with strength B1 to excite the atomic nuclei or "spins". The RF coils 130 can also detect signals emitted from the "relaxing" spins within the object being imaged. Accordingly, the RF coils 130 may be in the form of separate transmit coils 132 and receive coils 134 or a combined transmit and receive coil (not shown) with a switching mechanism for switching between transmit and receive modes.

The RF coils 130 may be implemented as surface coils, which are typically receive-only coils and/or volume coils which can be receive and transmit coils. RF coils 130 can be integrated in the main field magnet 110 bore. Alternatively, RF coils 130 may be implemented in closer proximity to the object to be scanned, such as a head, and can take a shape that approximates the shape of the object, such as a close-fitting helmet. An RF coil control unit 135 in communication with data processing system 105 may be used to control the operation of the RF coils 130 in either a transmit aspect or a receive aspect.

As shown in FIG. 1, data processing system 105 further includes a pulse sequence subsystem 160 for establishing one or more multiband pulse pairs for acquiring imaging data.

To obtain images from the MRI system 100, one or more sets of RF pulses and gradient waveforms (collectively called "pulse sequences") may be generated at the pulse sequence subsystem 160.

In the described embodiment, pulse sequence subsystem 160 is configured to initiate a plurality of multiband pulse pairs for simultaneously exciting or refocusing multiple bands. Each of the multiband pulse pairs includes a multiband excitation pulse, which is configured to simultaneously excite multiple bands, and a corresponding multiband refocusing pulse, which is configured to simultaneously refocus the multiple bands.

Pulse sequence subsystem 160 constructs these multiband pulses so that the phases of the bands excited and refocused by the multiband pulses within one pulse pair are consistent, or the generally the same. To achieve this, pulse sequence subsystem 160 may establish a multiband excitation pulse and a train of the corresponding multiband refocusing pulse, both of which correspond to the same row of an orthogonal encoding matrix, as discussed further below. In some examples, the orthogonal encoding matrix may be a Hadamard encoding matrix. Other orthogonal encoding matrices may be used as appropriate.

In order to enable separation of the multiple bands from the sampled signal, and reconstruction of images from the individual bands, pulse sequence subsystem 160 is configured to initiate more than one, i.e. a plurality of, multiband pulse pairs wherein least two pulse pairs have frequency bands with respective different phases. To achieve this, pulse sequence subsystem 160 transmits another multiband excitation pulse and corresponding multiband refocusing pulse, for exciting and refocusing the same set of multiple bands, using a different row of the orthogonal encoding matrix.

The number of multiband pulse pairs established by pulse sequence subsystem 160 may correspond to, or be less than, the number of slices in the multiple slices to be simultaneously imaged. For example, if four slices are to be simultaneously imaged, pulse sequence subsystem 160 may initiate four multiband pulse pairs. Establishing more pulse pairs than the number of slices in the multiple slices may provide for redundancy.

In such a case, a fourth-order Hadamard encoding matrix having four rows could be used and pulse sequence subsystem 160 may be configured to use each row of the Hadamard encoding matrix to construct the four multiband pulse pairs.

Alternatively, pulse sequence subsystem 160 may be configured to use fewer than all of the rows of the Hadamard encoding matrix when constructing the plurality of multiband pulse pairs.

Data processing system 105 then communicates these pulse pairs to the RF control unit 135 which instructs transmit coil 132 to generate each of the specified multiband pulse pairs in a multiband pulse sequence that achieves spin-echo or multi-spin-echo imaging. For example, one multiband pulse sequence generated by transmit coil 12 may include the multiband excitation pulse and a train of multiband refocusing pulses from one of the multiband pulse pairs.

In other embodiments, data processing system 105 may communicate the multiband pulse pair information to the RF control unit 135 and the gradient control unit 125, which collectively generate the associated waveforms and timings for providing a sequence of pulses to perform a scan. As such, while transmit coil 132 is shown in FIG. 1 to be a part of RF coils 130, transmit coil 132 may also be a part of gradient coils 120, such that the gradient coils 120 and the RF coils 130 collectively generate multiband pulse sequences.

Upon receiving sampled signal data from receive coil 134, pulse sequence subsystem 160 is further configured to multiply the signal data by the inverse of the orthogonal encoding matrix to separate the signals for each of the multiple bands to reconstruct images at each of the multiple bands.

While pulse sequence subsystem 160 can be part of any type of MRI system, in some examples MRI system 100 may be a low-field, e.g., approximately 0.5 T, MRI system.

Pulse sequence subsystem 160 also may not necessarily be a separate component in data processing system 105, in that the general processor of data processing system 105 may perform some or all of the above-noted steps in conjunction with the general memory of data processing system 105. Functions of pulse sequence subsystem 160 will be discussed in further detail below.

Figure 2:
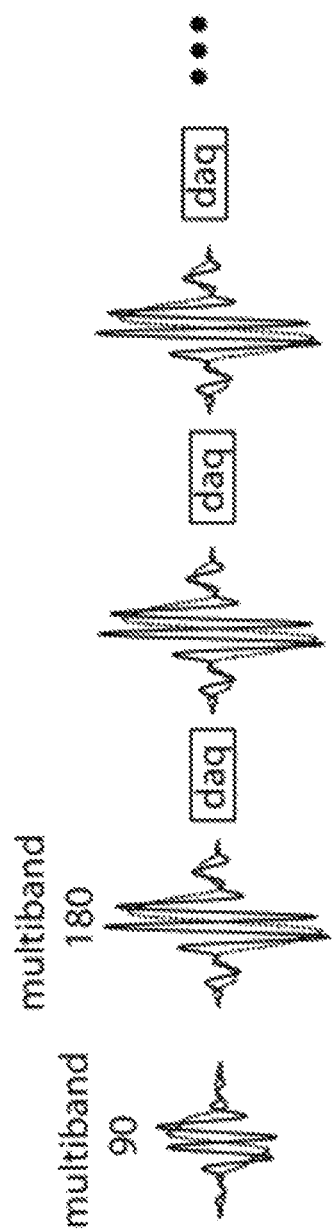
FIG. 2 shows an embodiment of a multiband excitation and refocusing pulse sequence that may be generated using the system of FIG. 1.

Referring now to FIG. 2, an embodiment of one multiband pulse sequence is shown that may be established by pulse sequence subsystem 160 and generated by transmit coil 132. The example pulse sequence shown in FIG. 2 includes a 90° multiband excitation pulse and a train of 180° multiband refocusing pulses. Each 90° multiband excitation pulse and each 180° multiband refocusing pulse are configured to simultaneously refocus multiple bands. Data is typically sampled/acquired following each refocusing pulse, as indicated by "daq" in FIG. 2

These multiband excitation and refocusing pulses have been constructed using a row of an orthogonal encoding matrix such that the phases of the 90° multiband excitation pulse and 180° multiband refocusing pulses are consistent or generally the same. This results in the example pulse sequence of FIG. 2. As described in further detail below, to encode the multiple bands, for example, N bands, the entire pulse sequence is repeated N times, with the multiband pulses corresponding to each of the N rows of the encoding matrix. In some examples, the encoding matrix may have more than N rows, in which case the multiband pulses may be derived from a subset of the rows of the encoding matrix.

Figure 3:
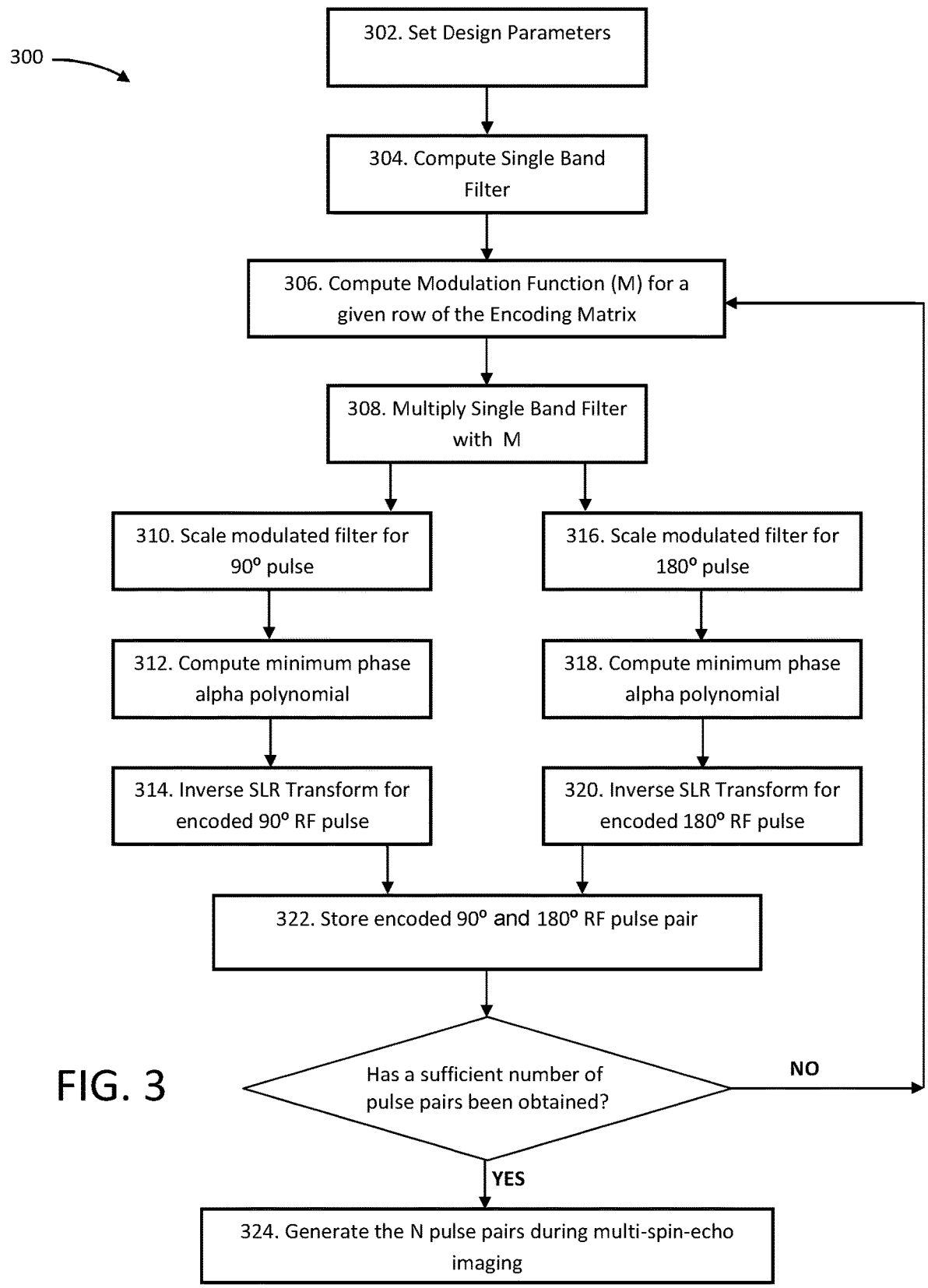
FIG. 3 is a flow chart showing an example method for performing MRI at multiple slice locations simultaneously.

Referring now to FIG. 3, there is shown an example imaging method 300 in accordance with an embodiment of the present disclosure. In some examples, method 300 may be at least in part operated using the MRI system 100 as shown in FIG. 1. Additionally, the following discussion of method 300 leads to further understanding of system 100. However, it is to be understood that system 100, and method 300 can be varied, and need not work exactly as discussed herein in conjunction with each other, and that such variations are within scope of the appended claims.

To generate a multiband pulse sequence based on specified constraints, a set of design parameters are obtained (e.g., via user input) at 302 which correspond to the desired characteristics for a single frequency band of the multiband pulse. Such parameters include, but are not limited to, bandwidth, transition width, and ripple amplitude for the single band. Input may also include selection of an encoding matrix and/or the number of bands to be simultaneously excited. The relative spacing of the bands relative to one another within the multiband pulse may also be specified. In the present embodiment, the encoding matrix is a Hadamard encoding matrix; other suitable encoding matrices may be used. The number of bands to be simultaneously excited may be calculated using a preferred or optimal number of bands for the particular imaging protocol. For example, for maximum SNR, the number of bands is given by the total number of slices desired in the imaging protocol, which may be based on the anatomy of interest, divided by the number of excitation and refocusing-train intervals that can be interleaved within a single repetition time (TR) (the length of the TR will depend on the desired contrast and MRI system used). For the present discussion, generally N bands will be simultaneously excited.

The duration of the imaging pass and the number of samples to be obtained from the RF pulses may also be determined (e.g., via user selection). An example protocol may use 16 to 24 refocusing pulses in the train of refocusing pulses, with the signal data being sampled or acquired after each refocusing pulse, as referenced by "daq" in FIG. 2.

After the design parameters are set, then the pulse pairs are initiated. A least-square digital filter design is used at 304 to compute the finite impulse response (FIR) filter coefficients corresponding to the single band filter design parameters, which correspond to a single band RF signal. The FIR filter may be referred to as the "beta-polynomial", $B_n(z)$.

For each row in the selected encoding matrix (e.g., the Hadamard matrix in the present case), a modulation vector (M) is computed. Since N bands were selected to be simultaneously excited, an N-th order Hadamard encoding matrix may be used to construct the pulses. As such, assuming that the selected encoding matrix has N rows the modulation vector (M) for row i is computed at 306. The calculation of M may be iterated through the necessary number of rows, from i=1 to i=N, until the desired number of pulse pairs has been obtained.

The single-band filter coefficients of $B_n(z)$ are then multiplied at 308 by the modulation function (M) for row i.

To establish a multiband excitation pulse, where each multiband excitation pulse is configured to simultaneously excite multiple bands, the modulated filter is then scaled for a flip angle of 90 degrees at 310. This scaled filter results in the beta-polynomial, which is one of the inputs of the Shinnar-Le Roux (SLR) transform. The beta polynomials for each band is then modulated to shift the band to the desired band position, and the sets of coefficients for each band are summed to produce a composite Bn(z), so a multiband RF pulse may be retrieved. Using these summed beta-polynomials within the SLR transform enables the control of the phases between the multiple bands when they are used for imaging.

The minimum phase alpha polynomial is then derived from the composite beta-polynomial at 312.

The inverse SLR transform is then used on the computed alpha and beta-polynomial at 314 to compute the 90° excitation RF pulse, i.e. the multiband excitation pulse.

To establish a refocusing multiband pulse, where each refocusing multiband pulse is configured to simultaneously refocus the multiple bands, the modulated filter noted above is then scaled for a flip angle of 180 degrees at 316, resulting in another multiband beta-polynomial.

Another minimum phase alpha-polynomial is then derived from this composite beta-polynomial at 318.

The inverse SLR transform is then used again on these subsequently computed alpha and beta-polynomials at 320 to compute the 180° refocusing RF pulse, i.e. resulting in the multiband refocusing pulse.

In this manner, the multiband excitation pulse and the multiband refocusing pulse corresponding to row i are established and stored at 322. It should be understood that obtaining the multiband excitation pulse and obtaining the multiband refocusing pulse may be performed in parallel. It is then determined if a sufficient number of multiband pulse pairs has been obtained. For example, i may be incremented by one and if i is not greater than N, then 306 to 322 are repeated for a subsequent row in the encoding matrix. In this manner, 306 to 322 would be repeated N times to produce N pairs of a multiband excitation pulse and a corresponding multiband refocusing pulse that are suitable for spin-echo or multi-spin-echo multiband imaging.

These N multiband pulse pairs, each comprising a multiband 90° excitation pulse and a multiband 180° refocusing pulse, may then be stored for future application, or they may be generated and applied during multi-spin-echo imaging at 324 in multiband pulse sequences.

Initial generation of the N pulse pairs during multi-spin-echo imaging may involve phase correction that is conventionally applied to the 90 degree excitation pulse to correct for spurious phases that perturbs the CPMG condition. This phase correction is applied to the phase of the bands of the 90 degree multiband pulse. The phase correction parameter(s) is(are) measured at each of the slice locations using a conventional single-band calibration scan at each of the N slice locations. For example, the phase correction method taught in U.S. Pat. No. 5,378,985 could be used to perform the single-band calibration scan. For each slice location, the single-band calibration scan gives measurements of zeroth order phase corrections, as well a first-order phase correction parameters for both the readout and phase-encoding directions.

Substantially, due to the use of the same row of the encoding matrix to derive the phase of the bands in both the 90° and 180° pulse profiles, the zeroth order phase correction parameter measured using the single-band calibration scan for each band location can be applied to the corresponding band of each of the N 90° multiband excitation pulses. Given that each excitation pulse and refocusing pulse are, respectively, 90° and 180° pulses, a local Carr Purcell Meiboom Gill (CPMG) condition is established in all of the simultaneously excited bands.

Figure 4:
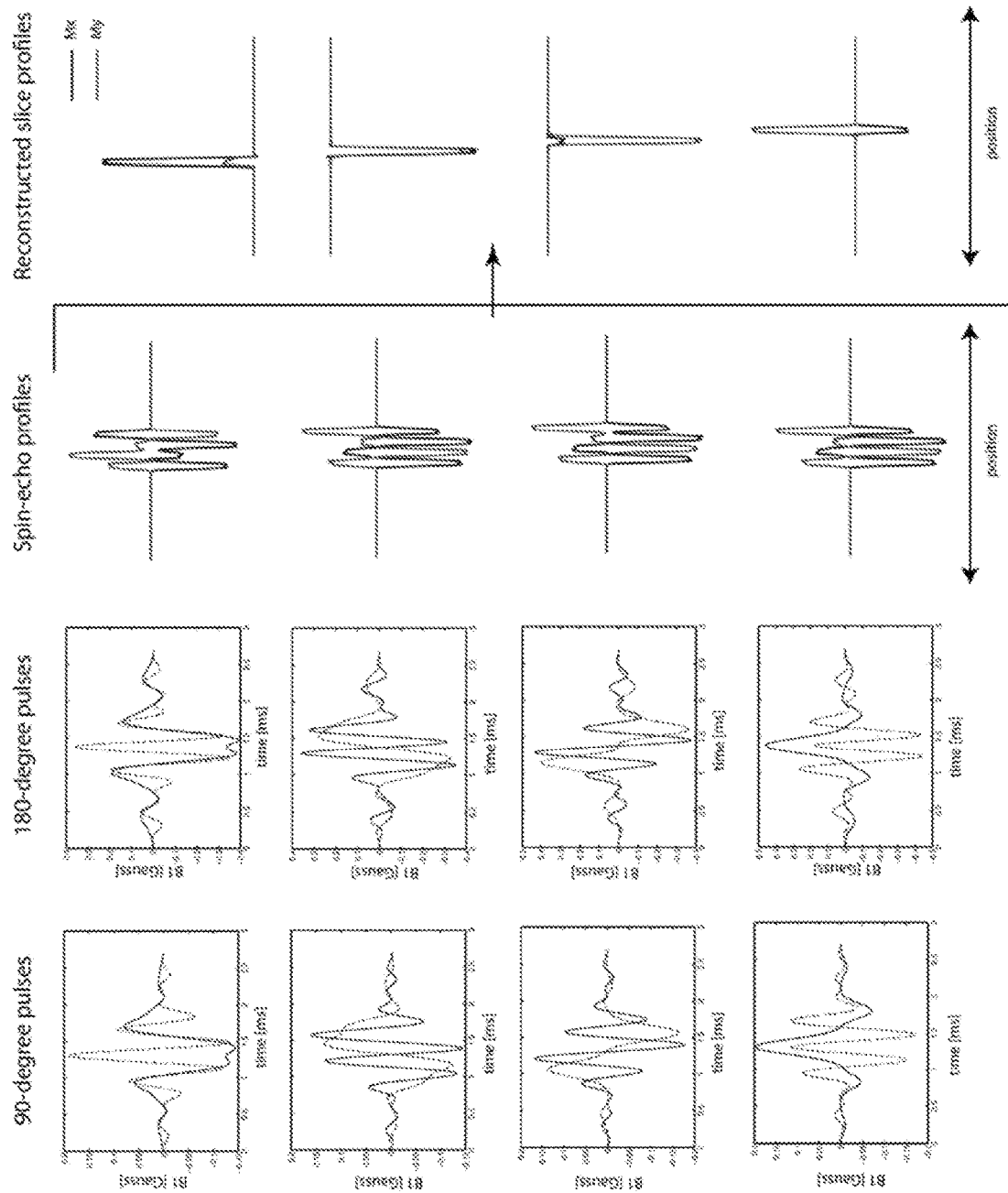
FIG. 4 shows example multiband excitation and multiband refocusing pulses for encoding four slices simultaneously.

In one preferred embodiment of the invention, the bands of the multiband pulses are adjacent, as shown in FIG. 4, so that the first order phase correction parameters are similar for all of the bands excited by each multiband pulse. In this embodiment, the average of the first-order correction parameters for the particular band locations can be used to correct the readout and phase-encode gradients used to image these band locations. In another preferred embodiment, the first-order phase correction parameters used to correct for both the readout and phase-encoding directions are not expected to vary with band (slice) location so these corrections can be applied to each of the N multiband acquisitions in the same manner as a conventional single-band acquisition.

Signal data may be sampled/acquired (e.g., using the receive coil) during the application of each multiband pulse sequence, e.g., following each of the multiband refocusing pulses. The use of a train of multiple refocusing pulses is typically used to get many phase encoding steps within a single repetition of the sequence. Each set of samples acquired between refocusing pulses may form a column in a matrix of sampled signal data. The signal data matrix may then be multiplied by the inverse of the encoding matrix to separate the signals for each of the individual bands to reconstruct images at each of the individual bands.

In the present embodiment, since N different multiband pulse sequences are applied to encode N slices, signal data from each individual band is sampled a factor of N times more than in the corresponding single-band pulse sequence. Thus, the net data acquisition time for each slice is increased by a factor of N. As a result, signal from each slice is subjected to analog-to-digital conversion N times longer than would be case for a single-band acquisition.

As noted above, in order to improve the SNR, either the voxel size has to increase or the sampling time has to increase. Therefore, according to the SNR equation, where:

$$SNR = V \cdot T^{1/2} \cdot R(B0, B1, \ldots) \cdot I_{seq}(T1, T2, TE, TR, \ldots)$$

wherein V is the voxel volume, T is the total sampling time for each voxel, R is a factor characterizing the SNR of the hardware and processing chain including the main magnetic field, the receive coil sensitivity etc, and $I_{seq}$ is a factor characterizing the signal intensity from the pulse sequence and the tissue, increasing T by a factor of N would increase SNR by a factor of $N^{1/2}$, i.e. a factor of the square root of N.

In this manner, the SNR for images acquired using MRI systems which use lower magnetic fields, such as 0.5 T, may be improved without vastly increasing sampling time.

In some examples, fewer than all of the rows of the encoding matrix may be used to construct the beta-polynomials. However, images from the individual bands may still be reconstructed. Typically, data corresponding to more than one row of the encoding matrix must be acquired in order to reconstruct images from the individual bands.

Where fewer than all the rows of the encoding matrix are used to construct the multiband pulses, fewer than N multiband pulse sequences are applied to encode the N slices simultaneously. In such a case, signal data from each individual slice is sampled M times, where M<N. Then, signal from each slice is subjected to analog-to-digital conversion for M times longer than would be case for a single-band acquisition. In this way, T would still be increased by a factor of M, and SNR would still increase by a factor of $(M)^{1/2}$.

To mitigate lower SNR, various examples disclosed herein act to increase the net data sampling time for each slice acquired in a multi-spin-echo pulse sequence, such that the image SNR is comparable to what would be achieved at higher magnetic fields with a conventional multi-spin-echo sequence.

FIG. 4 is an example of four pairs of a multiband excitation pulse and a multiband refocusing pulse that may be applied during spin-echo or multi-spin-echo imaging for imaging four slices simultaneously according to an example of the present disclosure. Each row shows a multiband pulse pair comprising a multiband (90°) excitation pulse and a multiband (180°) refocusing pulse. The phases of the bands for both the 90° and 180° pulses in each row are based on the same row of an encoding matrix, which substantially enables a CPMG condition at each of the band locations. As such, the only difference between the pulses in each row is their phases.

In the example of FIG. 4, each of the four bands will be excited then refocused multiple times by each row of pulses, resulting in the spin-echo profiles of the third column.

Following multiplication of the signal data by the inverse of the orthogonal encoding matrix, the signals for each of the multiple slice is reconstructed as shown in the reconstructed slice profiles of the fourth column of FIG. 4.

In this case, since four multiband pulse sequences are applied to excite four bands simultaneously, signal data from each individual slice is sampled four times, compared to a single-band acquisition. Thus, the net data acquisition time for each slice is increased by a factor four, and SNR should increase generally by a factor of $4^{1/2}=2$.

In various examples disclosed herein, a method and system of obtaining MR images with higher SNR for each slice in MRI systems which use lower magnetic fields is provided. By using multiband pulses, the acquisition time for each band is effectively increased, thus enabling a higher SNR over the same total acquisition time, compared to conventional approaches.

While some embodiments or aspects of the present disclosure may be implemented in fully functioning computers and computer systems, other embodiments or aspects may be capable of being distributed as a computing product in a variety of forms and may be capable of being applied regardless of the particular type of machine or computer readable media used to actually effect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as ROM, volatile RAM, non-volatile memory, cache or a remote storage device.

A computer readable storage medium may be used to store software and data which when executed by a data processing system causes the system to perform various methods or techniques of the present disclosure. The executable software and data may be stored in various places including for example ROM, volatile RAM, non-volatile memory and/or cache. Portions of this software and/or data may be stored in any one of these storage devices.

Examples of computer-readable storage media may include, but are not limited to, recordable and non-recordable type media such as volatile and non-volatile memory devices, read only memory (ROM), random access memory (RAM), flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like. The storage medium may be the internet cloud, or a computer readable storage medium such as a disc.

Furthermore, at least some of the methods described herein may be capable of being distributed in a computer program product comprising a computer readable medium that bears computer usable instructions for execution by one or more processors, to perform aspects of the methods described. The medium may be provided in various forms such as, but not limited to, one or more diskettes, compact disks, tapes, chips, USB keys, external hard drives, wire-line transmissions, satellite transmissions, internet transmissions or downloads, magnetic and electronic storage media, digital and analog signals, and the like. The computer useable instructions may also be in various forms, including compiled and non-compiled code.

At least some of the elements of the systems described herein may be implemented by software, or a combination of software and hardware. Elements of the system that are implemented via software may be written in a high-level procedural language such as object oriented programming or a scripting language. Accordingly, the program code may be written in C, C++, J++, or any other suitable programming language and may comprise modules or classes, as is known to those skilled in object oriented programming. At least some of the elements of the system that are implemented via software may be written in assembly language, machine language or firmware as needed. In either case, the program code can be stored on storage media or on a computer readable medium that is readable by a general or special purpose programmable computing device having a processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

While the teachings described herein are in conjunction with various embodiments for illustrative purposes, it is not intended that the teachings be limited to such embodiments. On the contrary, the teachings described and illustrated herein encompass various alternatives, modifications, and equivalents, without departing from the described embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

The invention claimed is:

1. A magnetic resonance imaging (MRI) system configured to perform a multiband pulse sequence to acquire a magnetic resonance image at multiple slices simultaneously, the MRI system comprising:
   a processor configured to transmit a multiband pulse pair, the pulse pair comprising:
      a multiband excitation pulse for simultaneously exciting multiple bands; and
      a multiband refocusing pulse for simultaneously refocusing the multiple bands;
      wherein the phases of each band in the multiband excitation pulse and the multiband refocusing pulse are set according to a row of an orthogonal encoding matrix; and
   a transmit coil coupled to the processor for generating a multiband pulse sequence comprising the multiband excitation pulse and at least one multiband refocusing pulse during spin-echo or multi-spin-echo imaging.

2. The system of claim 1 wherein the multiband pulse sequence generated by the transmit coil comprises a train of multiple multiband refocusing pulses during multi-spin-echo imaging.

3. The system of claim 2, wherein the processor is configured to establish a plurality of multiband pulse pairs using each of the rows of the orthogonal encoding matrix to set the phases of each band in each multiband pulse pair.

4. The system of claim 2, wherein the processor is configured to establish a plurality of multiband pulse pairs using fewer than all of the rows of the orthogonal encoding matrix to set the phases of each band in each multiband pulse pair.

5. The system of claim 3, further comprising a receive coil for sampling signal data during application of each multiband pulse sequence.

6. The system of claim 5, wherein the processor is further configured to multiply the signal data by the inverse of the orthogonal encoding matrix to separate the signals for each of the multiple bands to reconstruct images encoded by each of the multiple bands.

7. The system of claim 1, wherein the multiband excitation pulse is a 90° multiband excitation pulse and the multiband refocusing pulse is a 180° multiband refocusing pulse transmitted with a 90° phase shift relative to the excitation pulse, such that a local Carr Purcell Meiboom Gill (CPMG) condition is created in each of the multiple bands during the echo train.

8. The system of claim 1, wherein the system is a low-field MRI system.

9. A method of obtaining a magnetic resonance image by performing magnetic resonance imaging (MRI) at multiple slices simultaneously, the method comprising:
   generating a multiband pulse sequence for spin-echo imaging, the pulse sequence comprising a multiband excitation pulse and at least one multiband refocusing pulse,
   wherein the multiband excitation pulse simultaneously excites multiple bands;
   wherein the at least one multiband refocusing pulse simultaneously refocuses the multiple bands; and
   wherein the phases of the bands excited by the multiband excitation pulse and the phases of the bands refocused by the at least one multiband refocusing pulse are set according to a single row of an orthogonal encoding matrix, the multiband excitation pulse and the at least one multiband refocusing pulse collectively forming a multiband pulse pair.

10. The method of claim 9, wherein the multiband pulse sequence comprises multiple multiband refocusing pulses.

11. The method of claim 10, wherein the phase of a given band excited by the multiband excitation pulse and the phase of the corresponding band refocused by the multiband refocusing pulses are generally the same, in order to create a CPMG condition in all of the simultaneously excited bands.

12. The method of claim 11, wherein the orthogonal encoding matrix comprises a Hadamard encoding matrix.

13. The method of claim 12, further comprising generating a plurality of multiband pulse sequences, wherein the phases of the bands excited by each multiband excitation pulse and the phases of the bands refocused by each multiband refocusing pulse in each respective pulse pair are set according to a respective row of the orthogonal encoding matrix.

14. The method of claim 12, further comprising generating a plurality of multiband pulse sequences, wherein the phases of the bands excited by each multiband excitation pulse and the phases of the bands refocused by each multiband refocusing pulse in each respective pulse pair are set according to fewer than all of the rows of the orthogonal encoding matrix.

15. The method of claim 13, further comprising acquiring signal data during generation of each multiband pulse sequence, and multiplying the signal data by the inverse of the orthogonal encoding matrix to separate the signals for each of the multiple bands to reconstruct images at each of the multiple slices.

16. The method of claim 9, wherein the number of bands in the multiple bands is calculated using a total number of slices of the magnetic resonance image divided by the number of bands that can be interleaved within a repetition time of the MRI system.

17. The method of claim 9, wherein the multiband excitation pulse is a 90° excitation pulse and the at least one multiband refocusing pulse is a 180° refocusing pulse to create a local Carr Purcell Meiboom Gill (CPMG) condition at each of the multiple bands.

18. The method of claim 9, wherein the phases of the bands excited by the multiband excitation pulse and the phases of the bands refocused by the at least one multiband refocusing pulse are set according to a single row of an orthogonal encoding matrix by summing beta-polynomials within a Shinnar-Le Roux transform to enable control of the phases between the multiple bands and retrieve the multiband excitation pulse and corresponding multiband refocusing pulse.

19. The method of claim 18, wherein each beta-polynomial is designed using a digital filter design algorithm.

20. The method of claim 9, further comprising a zeroth order phase correction to the phase of each band in the multiband excitation pulse.

21. The method of claim 20, wherein the zeroth order phase correction is determined at the location of each of the bands using a single-band calibration scan at the location of each of the bands.

22. The method of claim 9, wherein the multiband pulse pair is for use in a low-field MRI system.

\* \* \* \* \*